(12) United States Patent
Hong et al.

(10) Patent No.: US 7,304,897 B2
(45) Date of Patent: Dec. 4, 2007

(54) METHOD AND SYSTEM FOR READING DATA FROM A MEMORY

(75) Inventors: Chen-Kuan Eric Hong, San Jose, CA (US); Yi-Jung Su, San Jose, CA (US)

(73) Assignee: VIA Technologies, Inc., Taipei (TW)

( * ) Notice: Subject to any disclaimer, the term of this patent is extended or adjusted under 35 U.S.C. 154(b) by 1041 days.

(21) Appl. No.: 10/404,425

(22) Filed: Apr. 2, 2003

(65) Prior Publication Data

US 2003/0221050 A1 Nov. 27, 2003

Related U.S. Application Data

(60) Provisional application No. 60/368,989, filed on Apr. 2, 2002, provisional application No. 60/368,991, filed on Apr. 2, 2002.

(51) Int. Cl.
*G11C 7/22* (2006.01)
*G11C 7/10* (2006.01)

(52) U.S. Cl. ............. 365/193; 365/220; 365/233; 365/189.02; 710/20; 710/21; 713/400

(58) Field of Classification Search ........... 365/189.02, 365/193, 220, 233, 63, 230.02; 710/20, 21; 713/400
See application file for complete search history.

(56) References Cited

U.S. PATENT DOCUMENTS 5,392,252 A * 2/1995 Rimpo et al. ......... 365/230.02

6,061,292 A    5/2000  Su et al.
6,987,700 B1 * 1/2006  Hong et al. ............... 365/194

OTHER PUBLICATIONS

U.S. Appl. No. 10/405,121, entitled Method and System for Writing Data to a Memory, filed Apr. 2, 2003.

* cited by examiner

*Primary Examiner*—J. H. Hur
(74) *Attorney, Agent, or Firm*—Finnegan, Henderson, Farabow, Garrett & Dunner LLP

(57) ABSTRACT

Methods and systems consistent with this invention comprise a control circuit for reading data from a memory comprising a plurality of data channels. Such control circuits comprise at least one multiplexer, wherein the at least one multiplexer is configured to route a data strobe signal to a first number of the plurality of data channels for reading the data from the memory when the at least one multiplexer is in a first selected state, and wherein the at least one multiplexer is configured to route the data strobe signal to a second number of the plurality of data channels, wherein the second number is greater than the first number, for reading the data from the memory when the at least one multiplexer is in a second selected state. Such methods and systems may also comprise a clock for generating a data strobe signal, and a flip-flop for latching the data from the memory into the control circuit with the data strobe signal, wherein the data strobe signal does not leave the control circuit.

41 Claims, 10 Drawing Sheets

US 7,304,897 B2

METHOD AND SYSTEM FOR READING DATA FROM A MEMORY

RELATED APPLICATIONS

This application claims priority to U.S. Provisional Application Nos. 60/368,989 and 60/368,991, both filed Apr. 2, 2002, which are hereby incorporated by reference. A method and system for writing data to a memory is found in U.S. patent application Ser. No. 10/405,121, filed on Apr. 2, 2003, now U.S. Pat. No. 6,987,700, entitled "Method and System for Writing Data to a Memory," and is hereby incorporated by reference.

RELATED FIELD

Methods and systems consistent with this invention may relate to reading data from a memory, and in particular may relate to a control circuit for reading data from a memory.

BACKGROUND

Generally, a memory control circuit (or "controller") coordinates writing and reading data to and from a memory. The data may originate from a central processing unit ("CPU"), for example, to be written to the memory. Alternatively, data may be read from the memory and sent to the CPU. As the capacity of memories increases and CPUs become faster, there is a need for data to be stored and retrieved in memory at increasing speeds.

FIG. 1 is a block diagram of a control circuit 102 and a memory 104 connected together. In this example, four signals span between control circuit 102 and memory 104: a clock signal MCLK, a data signal PD, a command signal CMD, and a data strobe signal DQS. FIG. 2 is a timing diagram for reading data from memory 104 to control circuit 102. In this example, data signal PD and data strobe signal DQS are supplied from memory circuit 104 to control circuit 102.

In the example of FIG. 2, command signal CMD triggers a read command at the rising edge of the signal MCLK. Data strobe signal DQS oscillates on and off at some time after read command signal CMD. Control circuit 102 uses strobe signal DQS to "clock" or "latch" in data signal PD into memory 104 at the rising and falling edges of strobe signal DQS. In this example, the falling edge of data strobe signal DQS occurs in the middle of a data bit D0 to ensure proper latching. Further, the rising edge of data strobe signal DQS falls in the middle of a data bit D1 to ensure the proper latching.

Memory 102 is a Double Data Rate (DDR) memory, where the rising and falling edges of data strobe signal DQS are used to latch data. Memories that supply data strobe signals are typically DDR memories. Different DDR memories may supply different numbers of data strobe signals in a read cycle. In contrast, single data rate (SDR) memories, where only one of the rising or falling edge of the DQS signal is used to latch data, usually do not supply data strobe signals.

One of the challenges of control circuit 102 and memory 104 is to align the DQS signals for proper latching. Another challenge of control circuit 102 is to provide compatibility with different memory types, such as SDR memories or DDR memories that supply different numbers of data strobe signals.

SUMMARY

Methods and systems consistent with this invention comprise a control circuit for reading data from a memory comprising a plurality of data channels. Such control circuits comprise at least one multiplexer, wherein the at least one multiplexer is configured to route a data strobe signal to a first number of the plurality of data channels for reading the data from the memory when the at least one multiplexer is in a first selected state, and wherein the at least one multiplexer is configured to route the data strobe signal to a second number of the plurality of data channels, wherein the second number is greater than the first number, for reading the data from the memory when the at least one multiplexer is in a second selected state.

Such methods and systems may also comprise a clock for generating a data strobe signal, and a flip-flop for latching the data from the memory into the control circuit with the data strobe signal, wherein the data strobe signal does not leave the control circuit.

It is understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference is now made in detail to the present embodiments of the invention, examples of which are illustrated in the accompanying drawings. Wherever possible, the same reference numbers are used throughout the drawings to refer to the same or like parts.

In one embodiment of the invention, a control circuit may be a chip that controls four memory chips. In one embodiment, each of the four memories supplies four DQS signals. Because each memory chip may have 32 channels (i.e., a 32 bit input/output bus), this embodiment may be referred to as "byte-per-DQS," i.e., 32 channels (bits) divided by four DQS signals or 8 channels (bits) per DQS signal. In another embodiment, each memory chip supplies one DQS signal, which is referred to as "double-word-per-DQS," i.e., 32 channels (bits) per DQS signal. Byte-per-DQS and double-word-per-DQS may be used in DDR memory systems where the rising and falling edge of the DQS signal is used to latch data into memory or into the controller.

Figure 1:
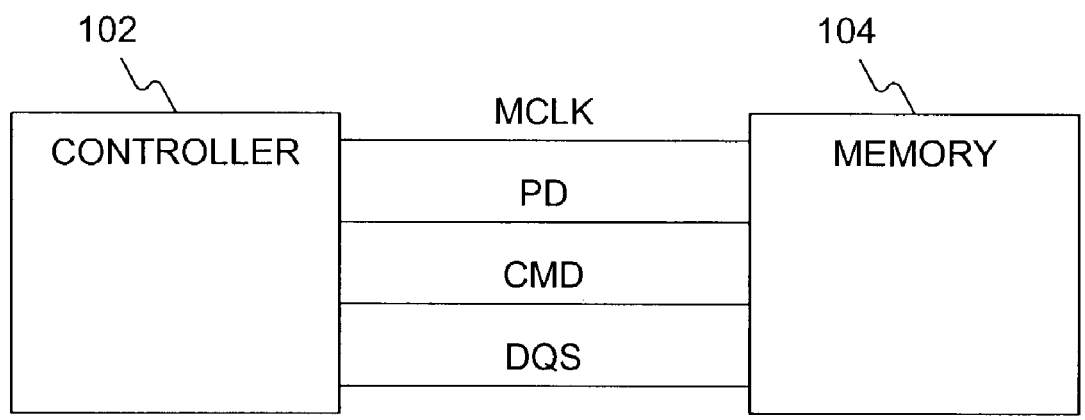
FIG. 1 is a block diagram of a control circuit and a memory connected together.
Figure 2:
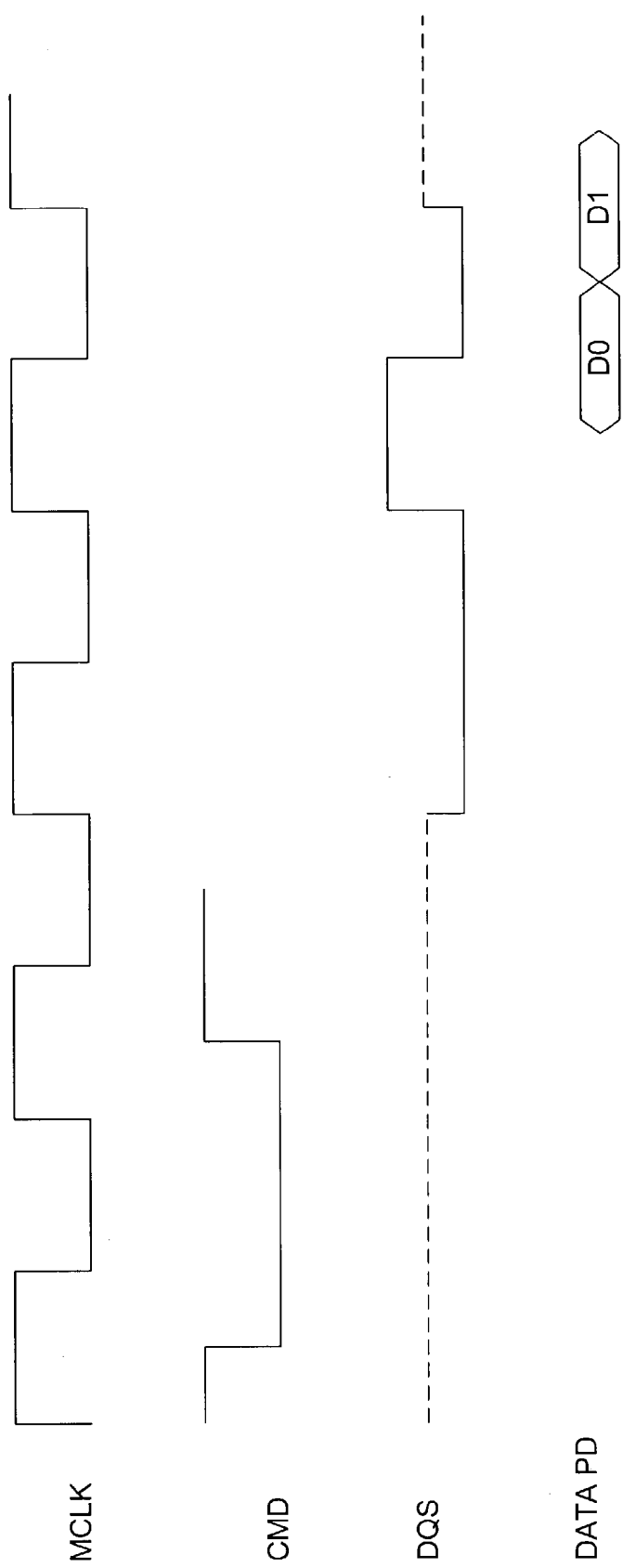
FIG. 2 is a timing diagram for reading data from the memory to the control circuit of FIG. 1.
Figure 3:
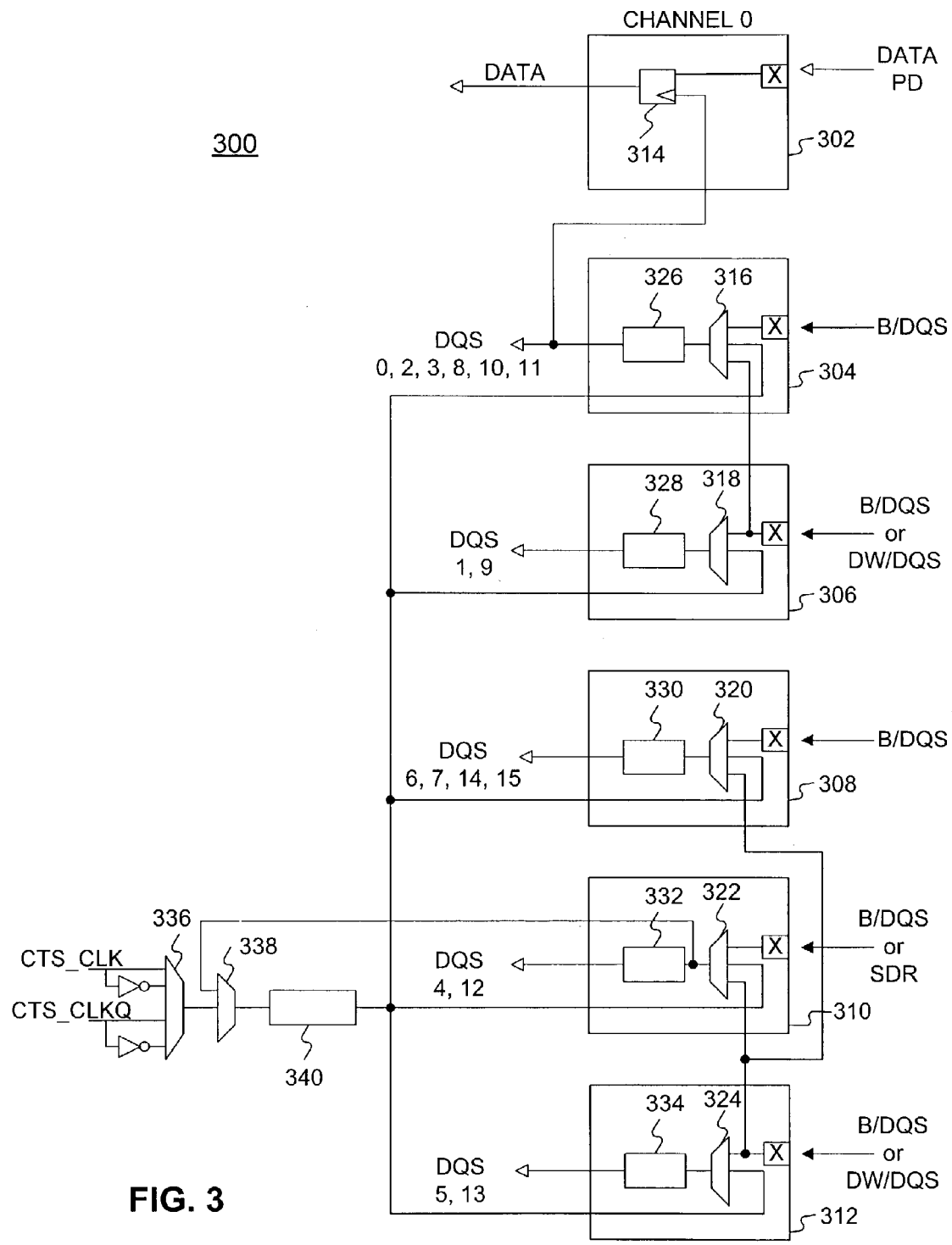
FIG. 3 is a circuit diagram of a control circuit, consistent with this invention, for reading data from a memory.

FIG. 3 is a circuit diagram of a control circuit 300, consistent with this invention, for reading data from a memory. In FIG. 3 and the following figures, the sixteen byte-per-DQS signals are labeled "B/DQS," and the four double-word-per-DQS signals are labeled "DW/DQS." Circuit 300 comprises five DQS pads 304-312, or five inputs where DQS signals may be supplied by a memory. Each of DQS pads 304-312 has an input pin that is marked by an "X." All DQS pads 304-312 are inputs for a byte-per-DQS signals. DQS pads 306 and 312 are inputs for double-word-per-DQS signals. There are fewer inputs for double-word-per-DQS signals than byte-per-DQS signals because, in this embodiment, there are four double-word-per-DQS signals, whereas there are sixteen byte-per-DQS signals. Each DQS pad 304-312 may have a multiplexer, such as multiplexers 316-324. Multiplexers 316-324 may be two-input multiplexers, such as multiplexers 318 and 324, or three-input multiplexers, such as multiplexers 316, 320, and 322. DQS pads 304-312 may have programmable delay circuits 326-334. Multiplexers 316-324 select one of the inputs and provides an output to delay circuits 326-334, respectively.

DQS pads 304-312 may output data strobe signals for each of sixteen (0-15) data channels. For example, DQS pad 304 may output a data strobe signal used in channels 0, 2, 3, 8, 10, and 11. DQS pad 306 may output a data strobe signal used in channels 1 and 9. DQS pad 308 may output a data strobe signal used in channels 6, 7, 14, and 15. DQS pad 310 may output a data strobe signal used in channels 4 and 12. DQS pad 312 may output a data strobe signal used in channels 5 and 13. For simplicity, only one data channel, channel 0, is shown in FIG. 3.

Figure 4:
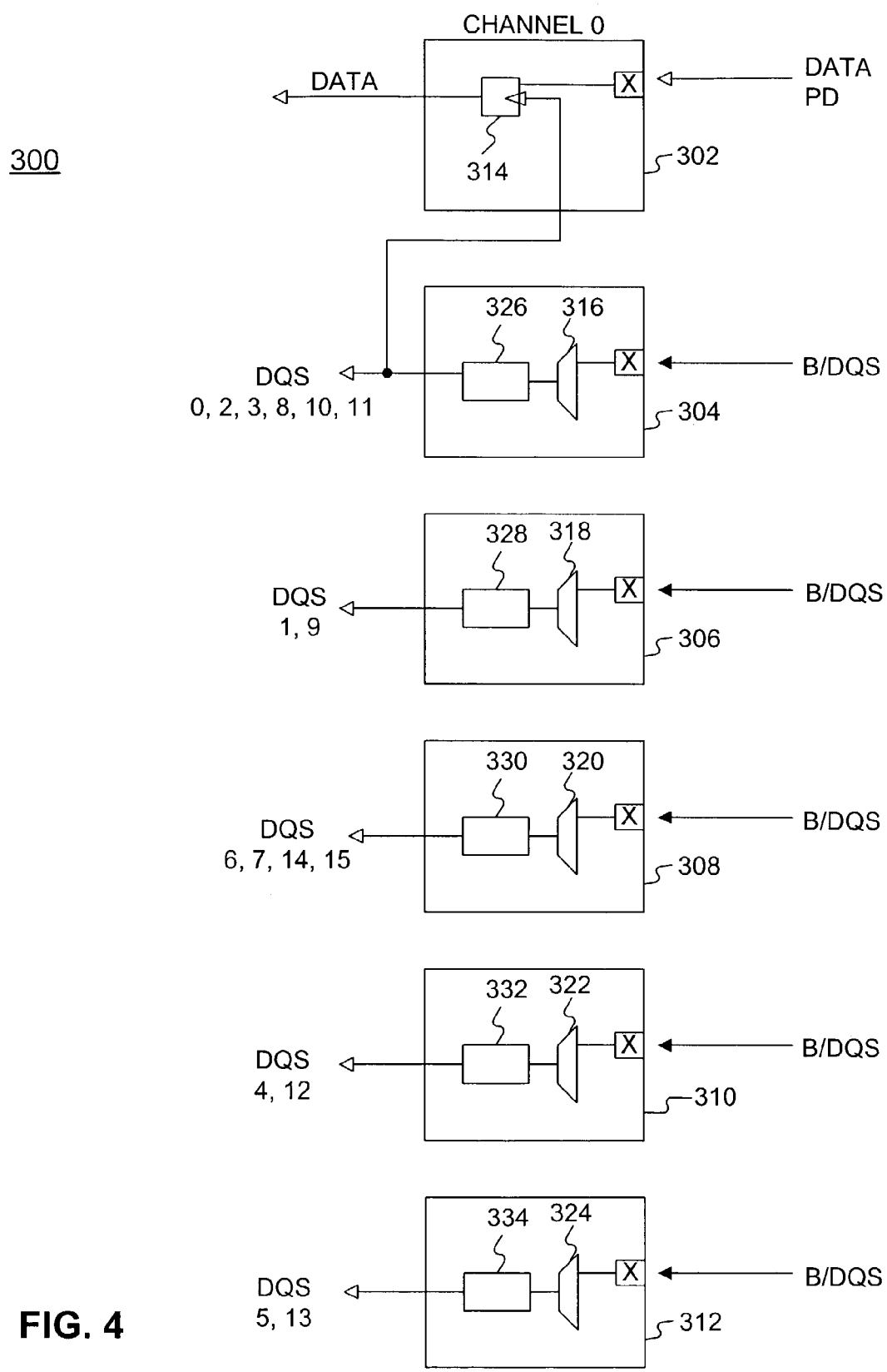
FIG. 4 is a circuit diagram of the circuit of FIG. 3, consistent with this invention, for reading data from a memory in a byte-per-DQS embodiment.

FIG. 4 is a circuit diagram of circuit 300, consistent with this invention, for reading data from a memory in a byte-per-DQS embodiment. For ease of viewing and understanding, some of the circuit components are removed from FIG. 3 to create FIG. 4. As discussed above, in the byte-per-DQS embodiment, there may be a separate DQS signal entering each of sixteen DQS pads in the controller. In this embodiment, multiplexers 316-324 select the signal path where the sixteen byte-per-DQS signals arrive, i.e. the signal path from the input pin. Each DQS pad may then delay each of the sixteen DQS signals using programmable delay circuits 326-334. Each DQS signal may then be fed to a data pad, such as data pad 302, and is used to latch in the data.

Thus, in FIG. 4, DQS pad 304 outputs DQS signals 0, 2, 3, 8, 10, and 11 from the input of the input pin of DQS pad 304. Likewise, DQS pad 306 outputs DQS signals 1 and 9 from the input pin of DQS pad 306. DQS pad 308 outputs DQS signals 6, 7, 14, and 15 from the input pin of DQS pad 308. DQS pad 310 outputs DQS signals 4, 12 from the input pin of DQS pad 310. Finally, DQS pad 312 outputs DQS signals 5 and 13 from the input pin of DQS pad 312. As described above, DQS signals 0-15 are used to latch data into the controller from channels 0-15.

Figure 5:
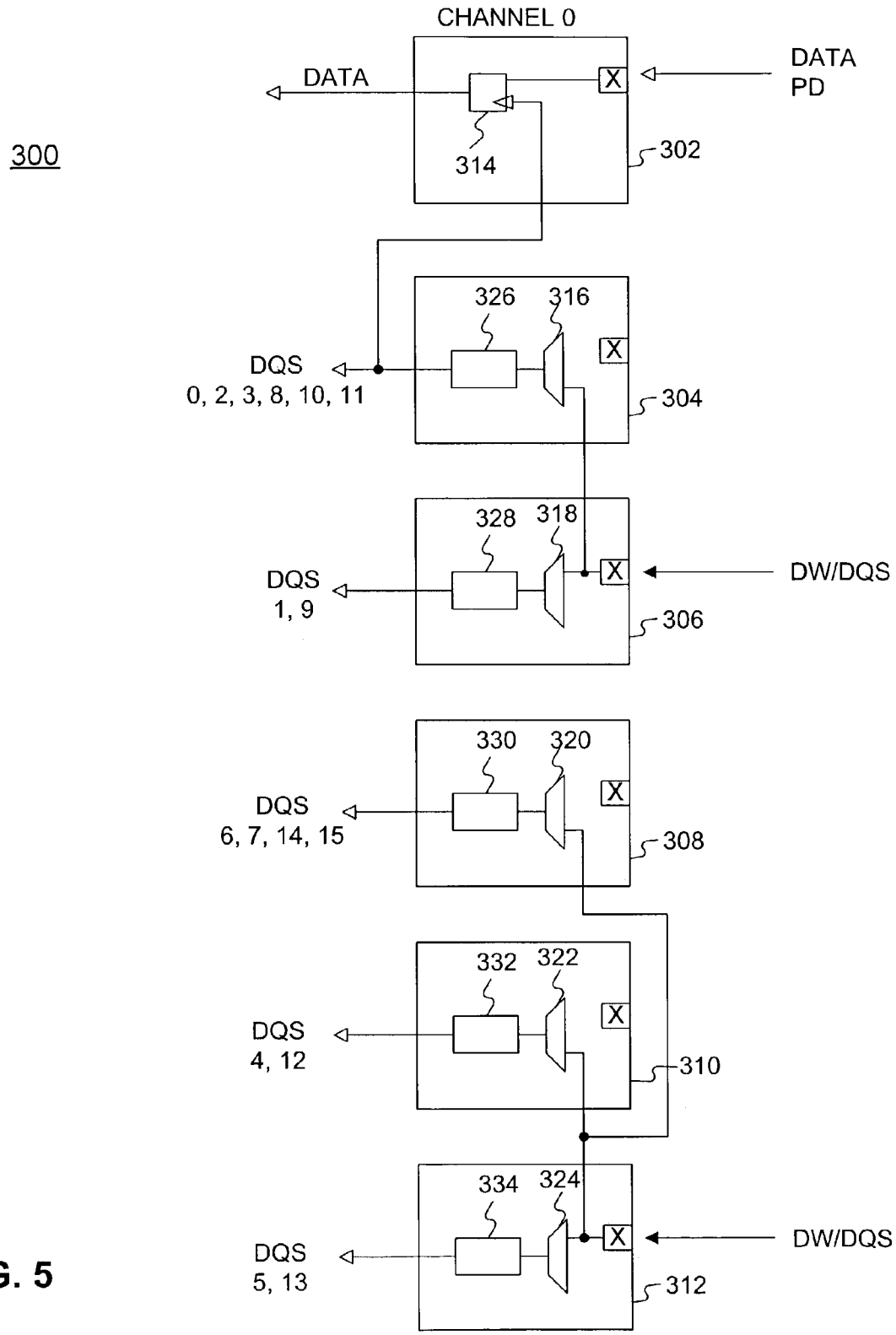
FIG. 5 is a circuit diagram of the circuit of FIG. 3, consistent with this invention, for reading data from a memory in a double-word-per-DQS embodiment.

FIG. 5 is a circuit diagram of circuit 300, consistent with this invention, for reading data from a memory in a double-word-per-DQS embodiment. For ease of viewing and understanding, some of the circuit components are removed from FIG. 3 to create FIG. 5. As discussed above, in the double-word-per-DQS embodiment, four DQS signals enter the controller. FIG. 5 shows five DQS pads 304-312, where two of those five DQS pads have inputs, specifically DQS pad 306 has an input and DQS pad 312 has an input. DQS pads 304, 308, and 310 do not have inputs on their respective input pins. Instead, multiplexer 316 in DQS pad 304 is set to select the DQS signal from the input pin of DQS pad 306. Likewise, multiplexer 320 in DQS pad 308 is set to select the DQS signal from the input pin of DQS pad 312. Multiplexer 322 in DQS pad 310 is also set to select the DQS signal from the input pin of DQS pad 312. Similar to FIG. 4, the output of each of the multiplexers 316-322 may be delayed by programmable delay circuits 326-334.

Thus, in FIG. 5, DQS pad 304 outputs DQS signals 0, 2, 3, 8, 10, and 11 from the input pin of DQS pad 306. Likewise, DQS pad 306 outputs DQS signals 1 and 9 from the input pin of DQS pad 306. DQS pad 308 outputs DQS signals 6, 7, 14, and 15 from the input pin of DQS pad 312. DQS pad 310 also outputs DQS signals 4, 12 from the input pin of DQS pad 312. Finally, DQS pad 312 outputs DQS signals 5 and 13 from the input pin of DQS pad 312. As described above, DQS signals 0-15 are used to latch data into the controller from channels 0-15.

Figure 6:
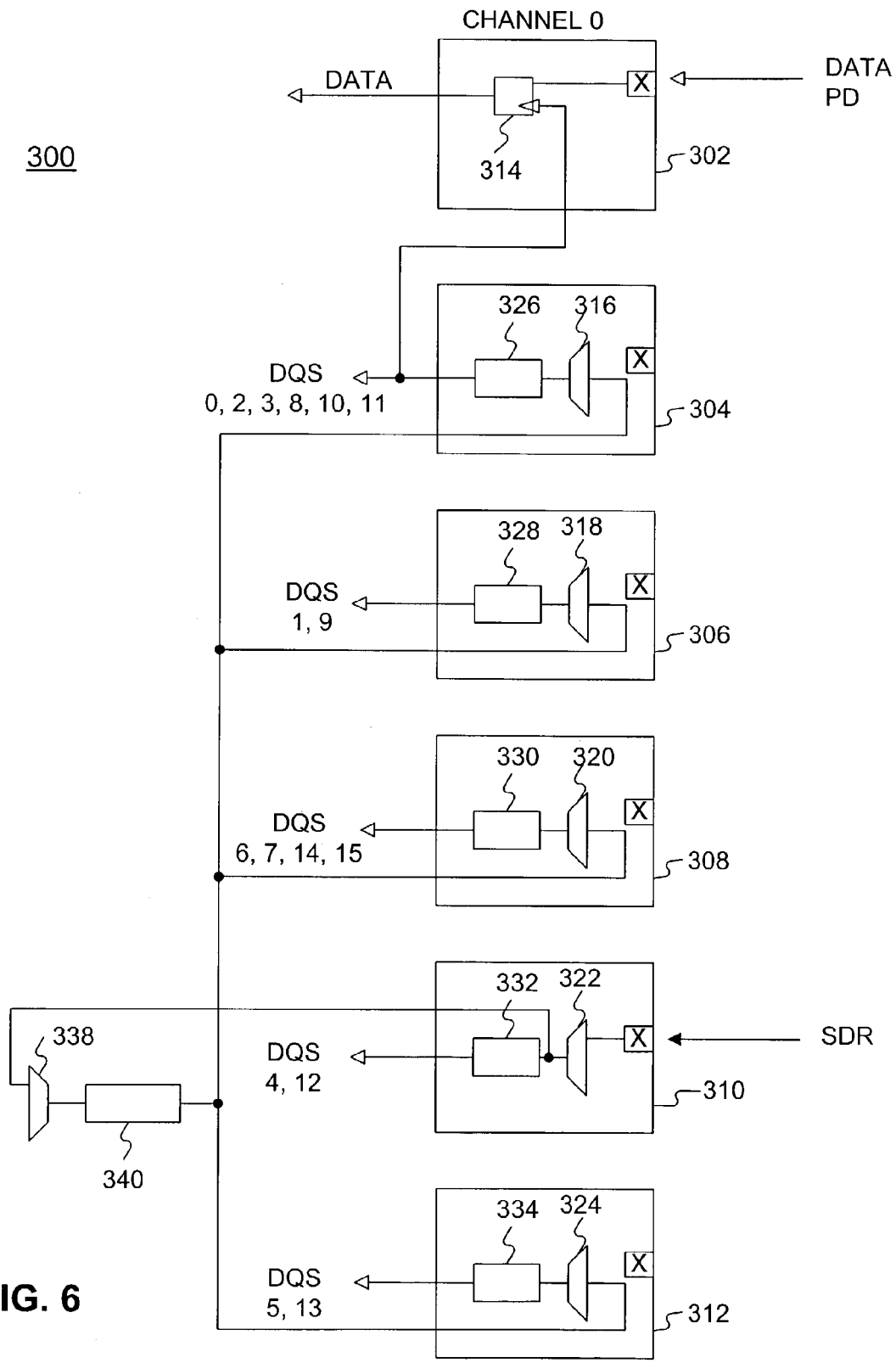
FIG. 6 is a circuit diagram of the circuit of FIG. 3, consistent with this invention, for reading data from a memory in an SDR embodiment.

FIG. 6 is a circuit diagram of circuit 300, consistent with this invention, for reading data from a memory in an SDR embodiment. For ease of viewing and understanding, some of the circuit components are removed from FIG. 3 to create FIG. 6. In the embodiment of an SDR memory, the SDR memory may not supply a DQS signal. For example, the DQS signal (labeled SDR in FIG. 6) may be the clock signal supplied to the memory by the controller. For example, clock signal MCLK output from the controller may run a path (not shown) to memory and then back from the memory as an input to the controller. This method is used to introduce a delay into the SDR DQS signal. In this embodiment, DQS pad 310 inputs the SDR DQS signal. Multiplexer 322 selects the signal from the input pin of DQS pad 310. The output of multiplexer 322 is also input into a multiplexer 338. In this embodiment, multiplexer 338 selects the output of multiplexer 322, which is the signal from the input pin of DQS pad 310. The output of multiplexer 338 may be delayed by a programmable delay circuit 340. The output of programmable delay circuit 340 is fed to DQS pads 304, 306, 308 and 312. Multiplexers 316, 318, 320, and 324 each select the output from delay circuit 340.

Thus, in FIG. 6, DQS pad 304 outputs DQS signals 0, 2, 3, 8, 10, and 11 from the input pin of DQS pad 310. Likewise, DQS pad 306 outputs DQS signals 1 and 9 from the input pin of DQS pad 310. DQS pad 308 outputs DQS signals 6, 7, 14, and 15 also from the input pin of DQS pad 310. DQS pad 310 also outputs DQS signals 4, 12 from the input pin of DQS pad 310. Finally, DQS pad 312 outputs DQS signals 5 and 13 from the input pin of DQS pad 310.

Figure 7:
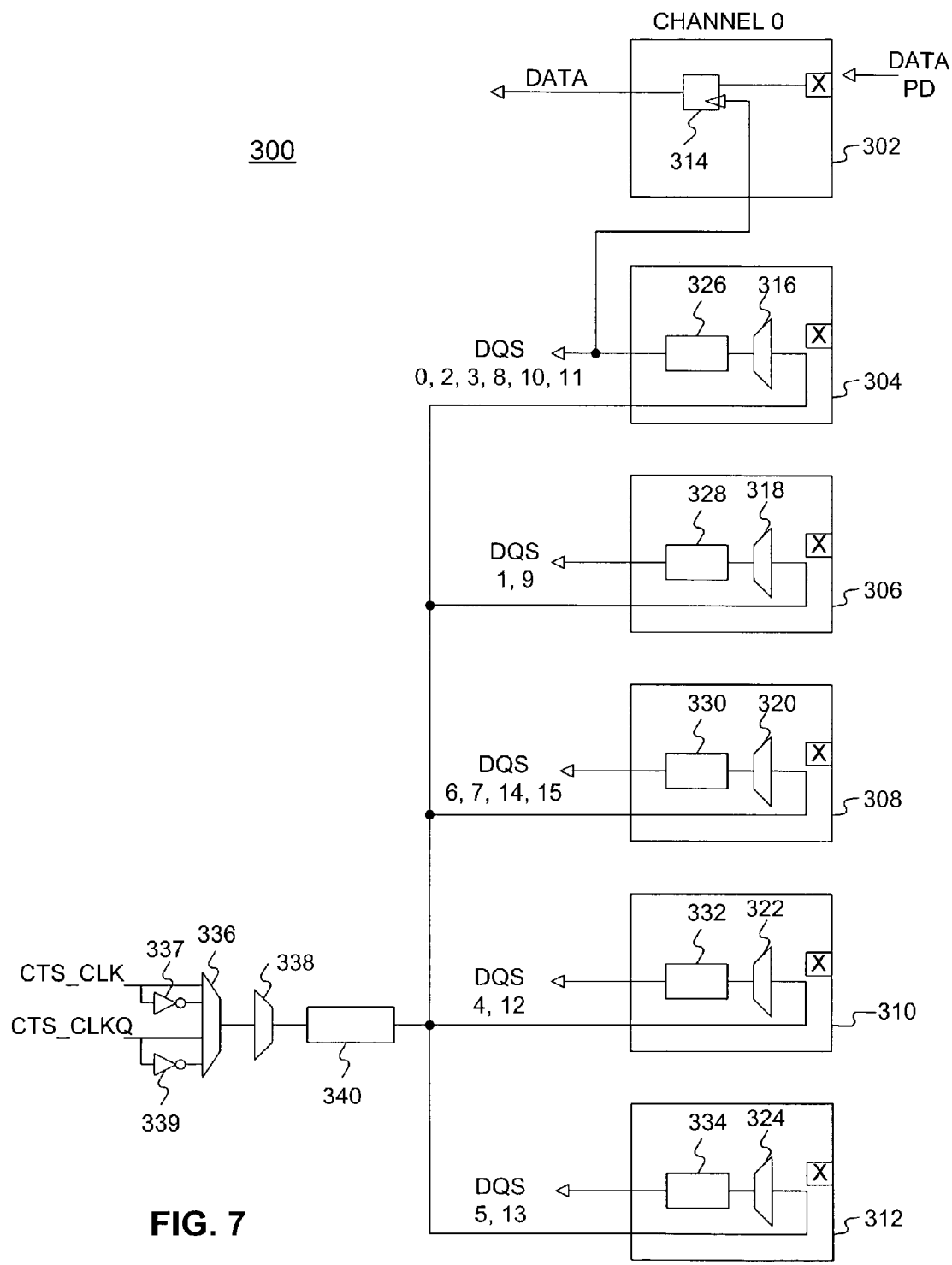
FIG. 7 is a circuit diagram of the circuit of FIG. 3, consistent with this invention, for reading data from a memory in another SDR embodiment.

FIG. 7 is a circuit diagram of circuit 300, consistent with this invention, for reading data from a memory in another SDR embodiment. For ease of viewing and understanding, some of the circuit components are removed from FIG. 3 to create FIG. 7. In FIG. 7, none of the DQS pads 304-312 input a DQS signal. Instead, a multiplexer 336 selects one of clock signal CTS_CLK, CTS_CLKQ, CTS_CLK~, or CTS_CLKQ~. Inverters 337 and 339 generate clock signals CTS_CLK~ and CTS_CLKQ~ by inverting clock signals CTS_CLK and CTS_CLKQ, respectively. Clock signals CTS_CLK and CTS_CLKQ are 90 degrees out of phase from each other. Thus, multiplexer 336 provides "quarter-clock selection," i.e., 90 degree phase selection of the clock, effectively delaying the signal CTS_CLK by 90 degrees, 180 degrees, or 270 degrees. Multiplexer 338 selects the output of multiplexer 336. As described in FIG. 6, the output of multiplexer 338 may be delayed by programmable delay circuit 340. The output of programmable delay circuit 340 is fed to DQS pads 304-312. Multiplexers 316-324 each select the output from delay circuit 340. Each of DQS pads 304-312 also introduce an additional delay with programmable delay circuits 326-334. Between the quarter clock selection of multiplexer 336 and programmable delay 340, the phase of the signal output from delay circuit 340 may be prgrammed between zero and 360 degrees.

Thus, in FIG. 7, DQS pad 304 outputs DQS signals 0, 2, 3, 8, 10, and 11 from the output of multiplexer 336. Likewise, DQS pad 306 outputs DQS signals 1 and 9 from the output of multiplexer 336. DQS pad 308 outputs DQS signals 6, 7, 14, and 15 also from the output of multiplexer 336. DQS pad 310 also outputs DQS signals 4, 12 from the output of multiplexer 336. Finally, DQS pad 312 outputs DQS signals 5 and 13 from the output of multiplexer 336.

One advantage of the embodiment of FIG. 7 over the embodiment of FIG. 6 is that DQS signals 0-15 may be generated from and stay within control circuit. Because all the DQS signals may stay within control circuit, there is less noise in DQS signals 0-15. In contrast, when clock signal MCLK is output from controller to memory and returned, the long signal path may act as an antenna to pick up noise. The method described in FIG. 7 is applicable to DDR memories as well.

As FIGS. 3 through 7 show, control circuit 300 is compatible with an SDR memory, a DDR memory supplying byte-per-DQS signals, or a DDR memory supplying double-word-per-DQS signals. It is apparent that control circuit 300 may be configured to be compatible with memories providing any number of data strobe signals.

Thus, a user may select a state of the control circuit where the multiplexers are configured to route a data strobe signal to a first number of data channels (i.e., six as in FIG. 4 from data pad 304, or four from data pad 308) for reading the data from the memory. The use may also select a state of the control circuit where the multiplexers are configured to route a data strobe signal to a second number of data channels (i.e., eight as in FIG. 5, data pads 308-312), wherein the second number is greater than the first number. Or, the user may also select a state of the control circuit where the multiplexers are configured to route a data strobe signal to a third number of the data channels (i.e., sixteen as in FIG. 6, data pads 304-312), wherein the third number is greater than the second number.

Figure 8:
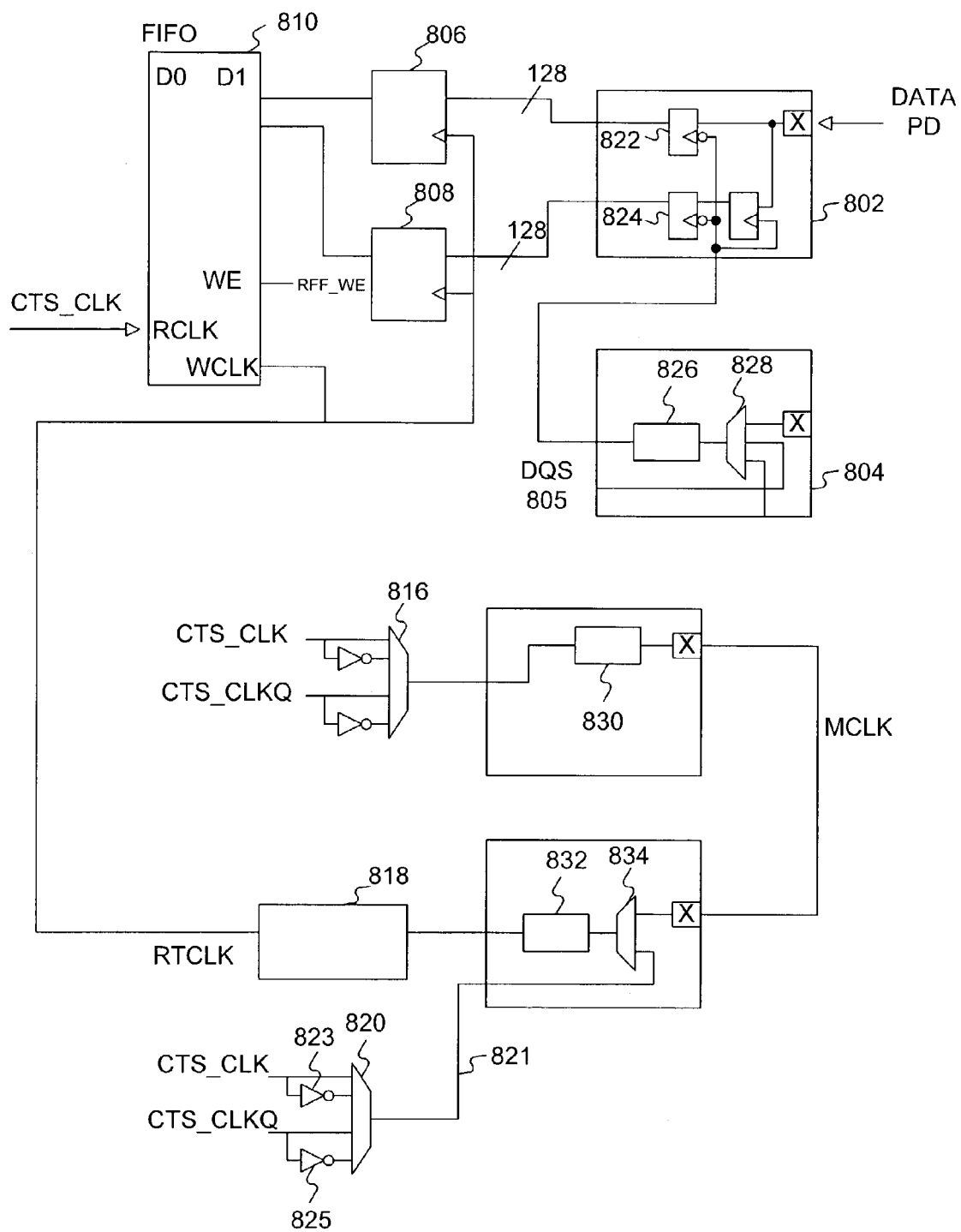
FIG. 8 is a circuit diagram of a control circuit for reading data from a memory consistent with this invention.

FIG. 8 is a circuit diagram of a control circuit for reading data from a memory consistent with this invention. Data enters a pad 802 and is latched in using a DQS signal 805 supplied by a DQS pad 804. Note that pad 802 may represent 128 separate data pads and DQS pad 804 may represent 16 DQS pads, for example. Data leaves data pad 802 and flows to flip flops 806 and 808. Flip-flops 806 and 808 use a clock signal RTCLK to latch the data from pad 802 to a FIFO 810. Note that flip-flops 806 and 808 may each represent 128 flip flops, one for each of the 128 data pads. Flip-flops 806 and 808 move the data from the "DQS domain" (having been latched by a data strobe signal) into the "RTCLK domain" (having been latched by clock signal RTCLK) Flip-flops 806 and 808 may be physically positioned in the controller to be close to the data pad 802. This physical positioning may allow the "fly time," i.e. the time it takes for the signal to reach FIFO 810, to be approximately the same from both flip-flops 806 and 808, and may guarantee a clock cycle of fly time 806 and 808 to 810. Clock signal RTCLK is also inputted into FIFO 810 where it is used in another set of flip-flops (not shown) to store the data in FIFO 810. Once the data is stored in FIFO 810, the data may be moved from the "RTCLK domain" to the "CTS_CLK domain" because FIFO 810 may be an asynchronous FIFO, e.g. the data in FIFO 810 may be latched out using clock signal CTS_CLK.

As shown in FIG. 8, clock signal RTCLK may be chosen from a return clock signal MCLK from outside the control circuit or from a clock signal 821 inside the control circuit. A multiplexer 834 selects either an internal signal 821 or external signal MCLK. A multiplexer 820 selects from one of CTS_CLK, CTS_CLK~, CTS_CLKQ, or CTS_CLKQ~, and issues internal signal 821. Inverters 823 and 825 generate clock signals CTS_CLK~ and CTS_CLKQ~ by inverting clock signals CTS_CLK and CTS_CLKQ, respectively. Clock signals CTS_CLK and CTS_CLKQ are 90 degrees out of phase from each other. Thus, multiplexer 820 provides "quarter-clock selection," i.e., 90 degree phase selection of the clock, effectively delaying the signal CTS_CLK by 90 degrees, 180 degrees, or 270 degrees.

The output of multiplexer 834 may be delayed by a programmable delay circuit 832. The output of programmable delay circuit 832 is fed into another programmable delay circuit 818 before reaching flip-flops 808 and 806. Between the quarter clock selection of multiplexer 820 and programmable delay circuits 832 and 818, the phase of the signal output from delay circuit 818 may be programmed between zero and 360 degrees. As described above, choosing internal clock signal from inside the control circuit has the advantage of reducing signal noise.

Figure 9:
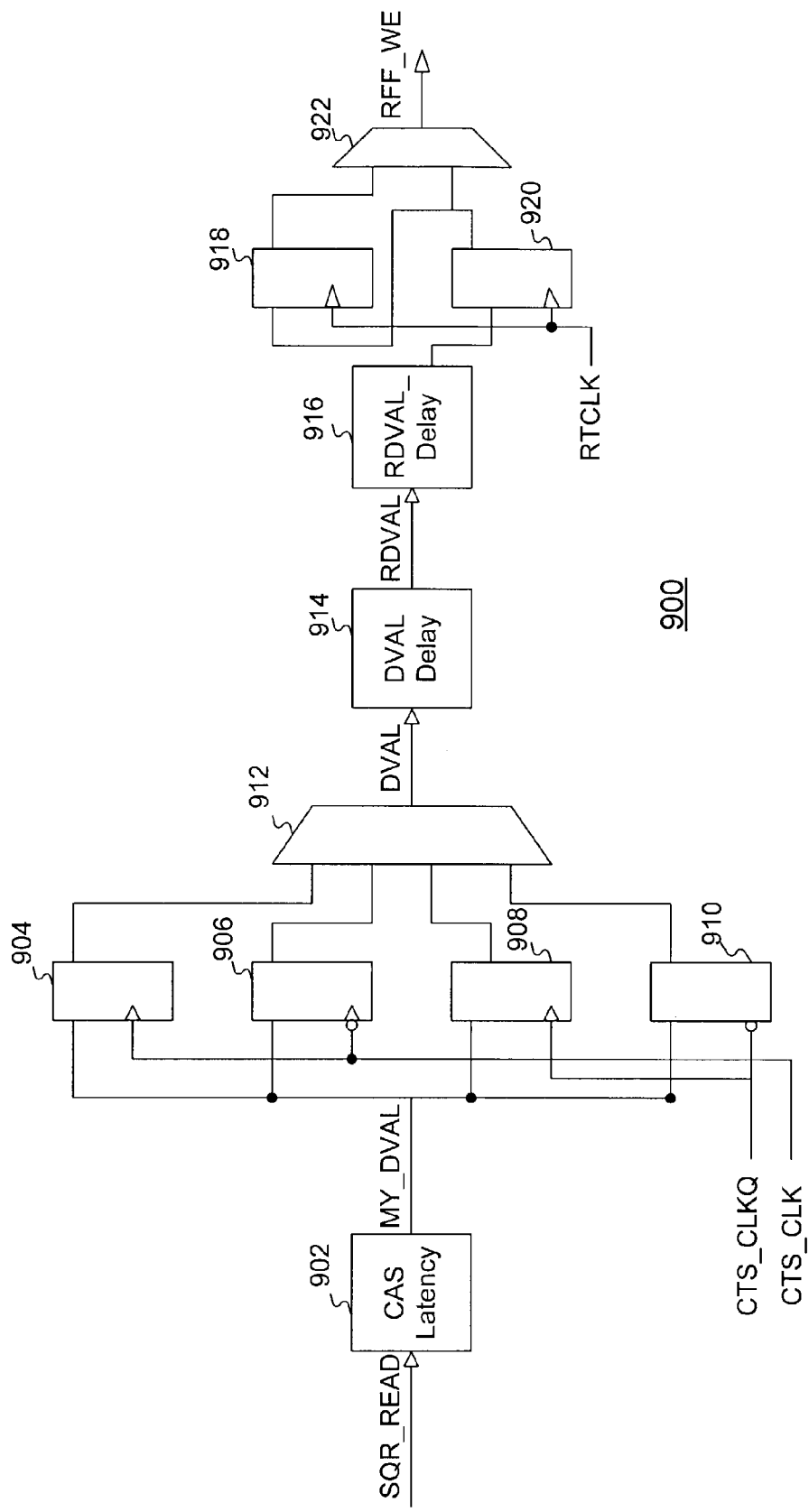
FIG. 9 is a circuit diagram of a latency circuit consistent with this invention.

FIG. 9 is a circuit diagram of a latency circuit 900 consistent with this invention. The circuit of FIG. 9 issues a write enable signal RFF_WE a certain number of cycles after a read command SOR_READ is received. The write enable signal RFF_WE is used to enable writing to FIFO 810 shown in FIG. 8 in the controller. The number of latency cycles is programmed by the user as 2-4 cycles, for example, in a CAS latency circuit 902. Signal MY_DVAL is then latched by flip-flops 904-910 to a multiplexer 912 with four different clocks, each being ninety degrees out of phase (CTS_CLK, CTS_CLKQ, CTS_CLK~, and CTS_CLKQ~). Multiplexer 912 selects one of the latched outputs and outputs signal DVAL. Signal DVAL may be further delayed by a delay circuit 914 forming another signal RDVAL. Signal RDVAL may be further delayed by a delay circuit 916. Two flip-flops 918 and 920, connected in series and using clock signal RTCLK to latch, may further delay the RDVAL signal. A multiplexer 922 selects either one flip-flop delay or two flip-flop delay.

Figure 10:
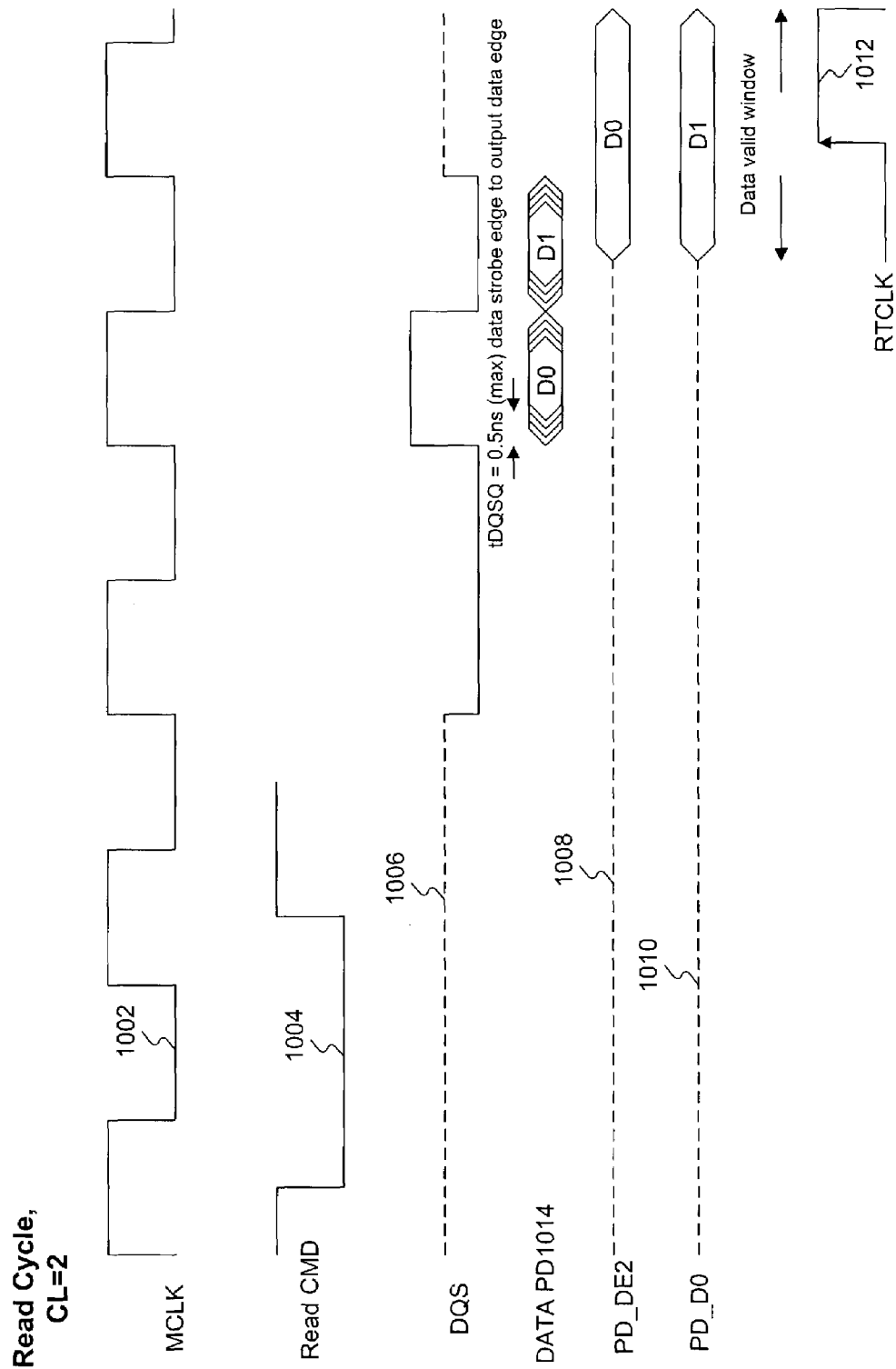
FIG. 10 is a timing diagram of signals consistent with this invention.

FIG. 10 is a timing diagram of signals consistent with this invention. FIG. 10 shows a memory clock signal MCLK 1002, a read command signal Read CMD 1004, a data strobe signal DQS 1006, a data signal PD 1014, a data signal PD_DE2 1008, a data signal PD_D0 1010, and a return clock signal RTCLK 1012. Control circuit supplies clock signal MCLK 1002 to the memory. Command signal CMD 1004 issues a read command at the rising edge of the signal MCLK. Data strobe signal DQS 1006 begins to oscillate at some time after command signal CMD 1004 issues the read command. Memory issues data strobe signal DQS 1006. In the embodiment of FIG. 10, the rising and falling edges of data strobe signal 1006 may occur approximately during the transition between data bits of data signal PD 1014. The data strobe signal DQS 1006 is delayed by the control circuit, such as control circuit 300 shown in FIGS. 3-7, so that when it latches in data signal PD 1014 the rising and falling edges may occur during the middle of the data bits.

After latching in data signal PD 1014, the control circuit generates data signal PD_DE2 1008 that carries every other data bit in data signal PD 1014. The control circuit also generates data signal PD_D0 1010 that carries every other data bit in data signal PD 1014 not carried by data signal PD_DE2 1008. Data signals PD_DE2 1008 and PD_D0 1010 may be generated by a data pad circuit such as data pad circuit 802 pictured in FIG. 8. Flip-flop 822 may issue data signal PD_D0 and flip-flop 824 may issue data signal PD_DE2. Clock signal RTCLK 1012 may latch the data in data signals PD_DE2 and PD_D0 into FIFO 810 if RFF_WE is active as shown in FIG. 8.

Other embodiments of the invention are apparent to those skilled in the art from consideration of the specification and practice of the invention disclosed herein. For example, although the memory and control circuit may separate chips, it is also possible that the memory and control circuit are in the same chip. Further, although flip-flops are shown in the figures, other components such as latches or different types of flip-flops may be used, and the term "flip-flop" is understood to include any type of latch or flip-flop. Also, in its broadest sense, clock signal RTCLK may also be considered a "data strobe signal" that latches data from the memory into the control circuit.

It is intended that the specification and examples be considered as exemplary only, with a true scope and spirit of the invention being indicated by the following claims.

What is claimed is:

1. A control circuit for reading data from a memory comprising a plurality of data channels, the control circuit comprising:
   at least one multiplexer,
      wherein the at least one multiplexer is configured to route a data strobe signal to a first number of the plurality of data channels for reading the data from the memory when the at least one multiplexer is in a first selected state, and
      wherein the at least one multiplexer is configured to route the data strobe signal to a second number of the plurality of data channels, wherein the second number is greater than the first number, for reading the data from the memory when the at least one multiplexer is in a second selected state.

2. The control circuit of claim 1, wherein the plurality of data channels comprise sixteen data channels, and wherein the first number is less than six.

3. The control circuit of claim 2, wherein the control circuit receives a data strobe signal for every eight data channels.

4. The control circuit of claim 2, wherein the control circuit receives a data strobe signal for every thirty-two data channels.

5. The control circuit of claim 1, wherein the plurality of data channels comprises sixteen data channels, and wherein the first number is less than eight.

6. The control circuit of claim 1, wherein the second number is equal to a number of the plurality of data channels.

7. The control circuit of claim 6, wherein the data strobe signal is generated from within the control circuit and does not leave the control circuit.

8. The control circuit of claim 1, further comprising at least one delay circuit to delay the data strobe signal.

9. The control circuit of claim 1, further comprising
   a FIFO; and
   a flip-flop, wherein the flip-flop latches data into the FIFO after reading the data from the memory.

10. The control circuit of claim 9, wherein the flip-flop inputs a return clock signal.

11. The control circuit of claim 10, wherein the return clock signal is generated from within the control circuit and does not leave the control circuit.

12. The control circuit of claim 9, further comprising
   a latency circuit to output a write-enable signal to the FIFO, wherein the write-enable signal is delayed a period of time after the latency circuit receives a read command.

13. The control circuit of claim 12, wherein the latency circuit comprises a selection circuit to select an output from a plurality of flip-flops, wherein each flip flop is latched by a clock with a different phase.

14. The control circuit of claim 12, wherein the latency circuit comprises a selection circuit to select an output from a plurality of flip flops, wherein each flip flop is connected in series.

15. A method for configuring a control circuit for reading data from a memory comprising a plurality of data channels, the control circuit comprising at least one multiplexer, the method comprising:
   selecting a configuration of the at least one multiplexer, wherein the configuration is one of at least routing a data strobe signal to a first number of the plurality of data channels for reading the data from the memory, and routing the data strobe signal to a second number of the plurality of data channels, wherein the second number is greater than the first number, for reading data from the memory.

16. The method of claim 15, wherein the plurality of data channels comprise sixteen data channels, and wherein the first number is less than eight.

17. The method of claim 16, wherein the control circuit receives a data strobe signal for every eight data channels.

18. The method of claim 16, wherein the control circuit receives a data strobe signal for every thirty-two data channels.

19. The method of claim 15, wherein the plurality of data channels comprises sixteen data channels, and wherein the first number is less than eight.

20. The method of claim 19, wherein the second number is equal to a number of the plurality of data channels.

21. The method of claim 20, further comprising generating the data strobe signal from within the control circuit, wherein the data strobe signal does not leave the control circuit.

22. The method of claim 15, further comprising delaying the data strobe signal.

23. The method of claim 15, further comprising latching the data into a FIFO after reading the data from the memory.

24. The method of claim 23, further comprising generating a return clock signal from within the control circuit, wherein the return clock signal does not leave the control circuit, and wherein latching the data into the FIFO comprises latching the data with the return clock signal.

25. The method of circuit of claim 23, further comprising
   outputting a write-enable signal to the FIFO, wherein the write-enable signal is delayed a period of time after a read command.

26. The method of claim 25, wherein outputting a write-enable signal comprises selecting an output from a plurality of flip-flops, wherein each flip flop is latched by a clock with a different phase.

27. The method of claim 25, wherein outputting a write-enable signal comprises selecting an output from a plurality of flip flops, wherein each flip flop is connected in series.

28. A control circuit for reading data from a memory comprising a plurality of data channels, the control circuit comprising at least one multiplexer, the control circuit comprising:
   means for selecting a configuration of the at least one multiplexer, wherein the configuration is one of at least routing a data strobe signal to a first number of the plurality of data channels for reading the data from the memory, and routing the data strobe signal to a second number of the plurality of data channels, wherein the second number is greater than the first number, for reading data from the memory.

29. The control circuit of claim 28, wherein the plurality of data channels comprise sixteen data channels, and wherein the first number is less than eight.

30. The control circuit of claim 29, wherein the control circuit receives a data strobe signal for every eight data channels.

31. The control circuit of claim 29, wherein the control circuit receives a data strobe signal for every thirty-two data channels.

32. The control circuit of claim 28, wherein the plurality of data channels comprises sixteen data channels, and wherein the first number is less than eight.

33. The control circuit of claim 32, wherein the second number is equal to a number of the plurality of data channels.

34. The control circuit of claim 33, wherein the data strobe signal is generated from within the control circuit and does not leave the control circuit.

35. The control circuit of claim 28, further comprising at least one delay circuit to delay the data strobe signal.

36. The control circuit of claim 28, further comprising
   a FIFO; and
   a flip-flop, wherein the flip-flop latches data into the FIFO after reading the data from the memory.

37. The control circuit of claim 36, wherein the flip-flop inputs a return clock signal.

38. The control circuit of claim 37, wherein the return clock signal is generated from within the control circuit and does not leave the control circuit.

39. The control circuit of claim 36, further comprising
   a latency circuit to output a write-enable signal to the FIFO, wherein the write-enable signal is delayed a period of time after the latency circuit receives a read command.

40. The control circuit of claim 36, wherein the latency circuit comprises a selection circuit to select an output from a plurality of flip-flops, wherein each flip flop is latched by a clock with a different phase.

41. The control circuit of claim 39, wherein the latency circuit comprises a selection circuit to select an output from a plurality of flip flops, wherein each flip flop is connected in series.

* * * * *